United States Patent
van der Wagt et al.

(10) Patent No.: US 11,119,155 B2
(45) Date of Patent: Sep. 14, 2021

(54) VOLTAGE DRIVER CIRCUIT

(71) Applicant: Teradyne, Inc., North Reading, MA (US)

(72) Inventors: Jan Paul Anthonie van der Wagt, Carlsbad, CA (US); Allan Parks, Westlake Village, CA (US); Lawrence Choi, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 83 days.

(21) Appl. No.: 16/395,098

(22) Filed: Apr. 25, 2019

(65) Prior Publication Data

US 2020/0341059 A1 Oct. 29, 2020

(51) Int. Cl.
*G01R 31/319* (2006.01)
*G05F 1/56* (2006.01)
*G01R 31/3183* (2006.01)

(52) U.S. Cl.
CPC .. *G01R 31/31924* (2013.01); *G01R 31/31905* (2013.01); *G01R 31/318307* (2013.01); *G05F 1/56* (2013.01)

(58) Field of Classification Search
CPC ...... G01R 31/31924; G01R 31/318307; G01R 31/31905; G05F 1/56
See application file for complete search history.

(56) References Cited

U.S. PATENT DOCUMENTS

| | | |
|---|---|---|
| 4,777,452 A | 10/1988 | Hayami et al. |
| 5,155,451 A | 10/1992 | Gladden et al. |
| 5,430,337 A | 7/1995 | Castello et al. |
| 5,436,581 A | 7/1995 | Oberhauser |
| 5,977,818 A | 11/1999 | Czarnul et al. |

(Continued)

FOREIGN PATENT DOCUMENTS

| JP | 5715525 B2 | 5/2015 |
|---|---|---|
| KR | 10-0601309 B1 | 7/2006 |

(Continued)

OTHER PUBLICATIONS

U.S. Appl. No. 16/395,082, van der Wagt et al., filed Apr. 25, 2019.

(Continued)

*Primary Examiner* — Akm Zakaria

(74) *Attorney, Agent, or Firm* — Wolf, Greenfield & Sacks, P.C.

(57) ABSTRACT

Disclosed herein are voltage driver circuits and methods of operating the same. In some embodiments, a plurality of circuit slices are provided in a voltage driver circuit, each circuit slice has a time constant, and is controlled to switchably connect a driver output to either a high voltage level or a low voltage level, or to disconnect the driver output from both voltage levels. The circuit slices may provide an adjustable output impedance, which may be set to match the impedance of different loads. The circuit slices may also provide adjustable voltages with low power consumption, particularly in high speed applications. The circuit slices may also have programmable capacitors that may be adjusted to provide a programmable time domain behavior of the output voltage waveform, such as a programmable voltage peaking characteristic.

20 Claims, 8 Drawing Sheets

(56) References Cited

U.S. PATENT DOCUMENTS

| | | | |
|---|---|---|---|
| 6,166,569 | A | 12/2000 | McQuilkin |
| 6,246,269 | B1 | 6/2001 | Schuler et al. |
| 6,252,441 | B1 | 6/2001 | Lee et al. |
| 6,526,113 | B1 | 2/2003 | Gutierrez et al. |
| 6,859,075 | B1 | 2/2005 | van der Wagt et al. |
| 7,187,742 | B1 | 3/2007 | Logue et al. |
| 7,671,630 | B2 | 3/2010 | Howe et al. |
| 8,446,169 | B1 | 5/2013 | Marlett et al. |
| 8,446,173 | B1 | 5/2013 | Faucher et al. |
| 8,760,188 | B2 | 6/2014 | Gondi et al. |
| 8,779,819 | B1 | 7/2014 | Venditti |
| 8,854,108 | B1 * | 10/2014 | Suzuki ............... H04L 25/0278 327/379 |
| 9,147,620 | B2 | 9/2015 | Van Der Wagt et al. |
| 9,231,631 | B1 | 1/2016 | Ke et al. |
| 9,281,969 | B2 | 3/2016 | Gondi et al. |
| 9,397,670 | B2 | 7/2016 | van der Wagt et al. |
| 9,503,065 | B1 | 11/2016 | van der Wagt et al. |
| 9,805,822 | B1 | 10/2017 | Aleksandrowicz |
| 9,887,710 | B1 | 2/2018 | Lim et al. |
| 10,048,717 | B1 | 8/2018 | Chen |
| 10,491,436 | B1 * | 11/2019 | Lim ....................... H04L 27/06 |
| 10,554,450 | B2 | 2/2020 | Elzeftawi et al. |
| 10,761,130 | B1 | 9/2020 | van der Wagt et al. |
| 2004/0095701 | A1 | 5/2004 | Ingino, Jr. |
| 2004/0263204 | A1 | 12/2004 | Chandler et al. |
| 2005/0193356 | A1 | 9/2005 | Kuekes et al. |
| 2006/0010360 | A1 | 1/2006 | Kojima |
| 2006/0238175 | A1 | 10/2006 | Cho et al. |
| 2006/0244479 | A1 * | 11/2006 | Major ................. H03K 17/163 326/29 |
| 2006/0256908 | A1 | 11/2006 | Ludwig |
| 2006/0273832 | A1 | 12/2006 | Matsumoto |
| 2007/0126410 | A1 | 6/2007 | Figoli |
| 2007/0229139 | A1 * | 10/2007 | Lin ................. H03K 3/356104 327/333 |
| 2008/0284466 | A1 | 11/2008 | Cranford, Jr. et al. |
| 2010/0299644 | A1 | 11/2010 | Kawai |
| 2011/0309865 | A1 | 12/2011 | Cordos |
| 2012/0086423 | A1 | 4/2012 | Dao et al. |
| 2012/0158348 | A1 | 6/2012 | Watanabe et al. |
| 2013/0027010 | A1 | 1/2013 | Groeneweg et al. |
| 2014/0035549 | A1 | 2/2014 | Hafizi et al. |
| 2014/0312865 | A1 | 10/2014 | Dobkin et al. |
| 2016/0065183 | A1 | 3/2016 | Antonie van der Wagt |
| 2016/0112223 | A1 | 4/2016 | Kitsukawa et al. |
| 2016/0173090 | A1 | 6/2016 | Meinerzhagen et al. |
| 2016/0182080 | A1 * | 6/2016 | Vasani ............... H03M 1/1028 341/145 |
| 2016/0227004 | A1 | 8/2016 | Conner |
| 2017/0155317 | A1 | 6/2017 | Wang |
| 2018/0329440 | A1 | 11/2018 | Jefremow et al. |
| 2019/0074838 | A1 | 3/2019 | Kitagawa |

FOREIGN PATENT DOCUMENTS

| | | |
|---|---|---|
| KR | 10-0605498 B1 | 7/2006 |
| KR | 10-0618828 B1 | 8/2006 |
| KR | 10-0798835 B1 | 1/2008 |

OTHER PUBLICATIONS

U.S. Appl. No. 16/395,104, van der Wagt et al., filed Apr. 25, 2019.

U.S. Appl. No. 16/395,120, van der Wagt et al., filed Apr. 25, 2019.

[No Author Listed], LVDS Owner's Manual. Texas Instruments. 4th Edition. 2008. 111 pages. http://www.ti.com/interface/lvds-m-lvds-pecl/technical-documents.html [last accessed: Jul. 17, 2019].

Branson, Integrated Tester Pin Electronics. IEEE Design & Test of Computers. 1990;7:4-14.

Cherry et al., The design of wide-band transistor feedback amplifiers. Proceedings of the Institution of Electrical Engineers. 1963;110(2):375-389. DOI: 10.1049/piee.1963.0050.

Dettloff et al., A 32mW 7.4Gb/s Protocol-Agile Source-Series-Terminated Transmitter in 45nm CMOS SOI. IEEE International Solid-State Circuits Conference Digest of Technical Papers. Feb. 10, 2010. p370-371. DOI: 10.1109/ISSCC.2010.5433825.

Enz et al., Charge-Based MOS Transistor Modeling. John Wiley & Sons. 2006. Section 4.4.4. p4142. ISBN: 047085541X.

Ershov et al., EDA software for verification of metal interconnects in ESD protection networks at chip, block, and cell level. 35th Electrical Overstress/Electrostatic Discharge Symposium. Sep. 2013. p. 1-7.

Esch et al., Near-Linear CMOS I/O Driver With Less Sensitivity to Process, Voltage, and Temperature Variations. IEEE Transactions on VLSI Systems. 2004;12(11):1253-7. DOI: 10.1109/TVLSI.2004.836321.

Greshishchev et al., A 60-dB Gain, 55-dB Dynamic Range, 10-Gb/s Broad-Band SiGe HBT Limiting Amplifier. IEEE Journal of Solid-State Circuits. 1999;34(12):1914-20. DOI: 10.1109/4.808916.

Hatamkhani et al., A 10mW 3.6Gbps I/O Transmitter. Symposium on VLSI Circuits. Jun. 2003. p. 97-98. DOI: 10.1109/VLSIC.2003.1221172.

Knight et al., A Self-Terminating Low-Voltage Swing CMOS Output Driver. IEEE Journal of Solid-State Circuits. 1988;23(2):457-64. DOI: 10.1109/4.1007.

Kojima et al., 8Gbps CMOS Pin Electronics Hardware Macro with Simultaneous Bi-directional Capability. IEEE International Test Conference. Nov. 2012. p. 1-9. DOI: 10.1109/TEST.2012.6401543.

Kossel et al., A T-Coil-Enhanced 8.5 Gb/s High-Swing SST Transmitter in 65 nm Bulk CMOS With < -16 dB Return Loss Over 10 GHz Bandwidth. IEEE Journal Solid-State Circuits. 2008;43(12):2905-2920. DOI: 10.1109/JSSC.2008.2006230.

Laskin, On-Chip Self-Test Circuit Blocks for High-Speed Applications. Thesis submitted for MS of Applied Science Graduate Department of Electrical and Computer Engineering. University of Toronto. 2006. Chapter 2.3. p. 13-16.

Nauta et al., Analog Line Driver with Adaptive Impedance Matching. IEEE Journal of Solid-State Circuits. 1998;33(12):1992-8. DOI: 10.1109/4.735540.

O'Reilly, Series-Parallel Generation of m-Sequences. Radio and Electronic Engineer. 1975;45(4):171-6. DOI: 10.1049/ree.1975.0033.

Sayag et al., Compact Modeling and Comparative Analysis of Silicon-Chip Slow-Wave Transmission lines With Slotted Bottom Metal Ground planes. IEEE Transaction on Microwave Theory and Techniques. 2009;57(4):840-7. DOI: 10.1109/TMTT.2009.2015041.

Schneider et al., CMOS Analog Design Using All-Region MOSFET Modeling. Cambridge University Press. 2010. Section 1.2.3. p. 7-14. ISBN: 052111036X.

Tanzawa et al., High-Voltage Transistor Scaling Circuit Techniques for High-Density Negative-Gate Channel-Erasing NOR Flash Memories. IEEE Journal of Solid-State Circuits. 2002;37(10):1318-25. DOI: 10.1109/JSSC.2002.803045.

Tsividis, Operation and Modeling of the MOS Transistor. Oxford University Press. 2nd Edition. 1999. Section 4.5.2. p. 156-158. ISBN: 0195170146.

Van Der Wagt et al., 50Gb/s 3.3V Logic ICs in InP-HBT Technology. Symposium on VLSI Circuits Digest of Technical Papers. Jun. 2004. p. 326-329. DOI: 10.1109/VLSIC.2004.1346604.

Wallinga et al., Design and Analysis of CMOS Analog Signal Processing Circuits by Means of a Graphical Most Model. IEEE J. Solid-St. Circuits. 1989;24(3):672-80. DOI: 10.1109/4.32024.

Zheng et al., Capacitive Floating Level Shifter: Modeling and Design. IEEE Region 10 Conference. Nov. 2015. 6 pages. DOI: 10.1109/TENCON.2015.7373013.

PCT/US2020/029484, Aug. 11, 2020, International Search Report and Written Opinion.

PCT/US2020/029490, Aug. 11, 2020, International Search Report and Written Opinion.

PCT/US2020/029499, Aug. 5, 2020 International Search Report and Written Opinion.

International Search Report and Writen Opinion for International Application No. PCT/US2020/029484, dated Aug. 11, 2020.

(56) References Cited

OTHER PUBLICATIONS

International Search Report and Writen Opinion for International Application No. PCT/US2020/029490, dated Aug. 11, 2020.
International Search Report and Writen Opinion for International Application No. PCT/US2020/029499, dated Aug. 5, 2020.
Van Der Wagt et al., Parallel Path Delay Line, U.S. Appl. No. 16/395,082, filed Apr. 25, 2019.
Van Der Wagt et al., Voltage Driver With Supply Current Stabilization, U.S. Appl. No. 16/395,104, filed Apr. 25, 2019.
Van Der Wagt et al., Voltage Driver Circuit Calibration, U.S. Appl. No. 16/395,120, filed Apr. 25, 2019.

* cited by examiner

VOLTAGE DRIVER CIRCUIT

BACKGROUND

Electronic components, such as semiconductor devices, circuits, and printed circuit board (PCB) assemblies, are frequently tested, during and after their manufacture, using a test system such as an automated test equipment (ATE). To perform these tests, an ATE may include instruments that generate or measure test signals such that a range of operating conditions can be tested on a particular device-under-test (DUT). An instrument, for example, may generate a pattern of digital or analog signals that are applied to a semiconductor device, and may measure digital or analog signals from the semiconductor device as a response.

An ATE is frequently used to apply a test signal with a specific voltage waveform to one or more test points of the DUT. To generate such a test signal, the ATE may comprise a voltage driver that generates programmable voltage levels. A voltage driver may be single-ended and provide a programmable output voltage at a single output port for connection to a test point on the DUT. A voltage driver may alternatively be differential and generate a differential voltage signal to drive DUTs that take differential signals as input. The generated differential voltage signal comprises two voltage waveforms that are usually of opposite phase at a pair of differential outputs.

Voltage levels at the output of a voltage driver may be programmed by a digital input, either specified at a user input or from digital signals received from the rest of the ATE. The output granularity, or number of distinct fractional voltage levels that can be generated by a voltage driver from one or more fixed supply voltages, is generally based on the decimal permutations of binary bits in the digital signal received by the voltage driver. For example, a voltage driver with 8-bit voltage level control is able to generate up to a permutation of 256 distinct output voltage levels, while a voltage driver with 16-bit voltage level control can generate up to 65,536 distinct output voltage levels.

SUMMARY

Aspects of the present application are directed to voltage driver circuits and methods of operating the same to provide an output voltage. The inventors have recognized and appreciated designs for a voltage driver circuit that enable multiple characteristics at the driver output to be programmed. These characteristics may include one or more of: voltage level, output impedance and/or time domain behavior. An adjustable output impedance, for example, may be programmed to match the impedance of different loads, providing adjustable voltages with low power consumption, particularly in high speed applications. Further, by adjusting time domain behavior of the output voltage swings, voltage peaking behavior may be controlled. Accordingly, such a driver may enable a test system to generate waveforms that more reliably or more quickly test a semiconductor device under test.

According to some embodiments, a voltage driver is provided. The voltage driver comprises a driver output and a plurality of circuit slices. Each circuit slice comprises a time constant, and one or more switches configured to switchably connect the driver output to a first voltage level or a second voltage level. Switches in the plurality of circuit slices are configured to disconnect at least a first circuit slice having a first time constant from the first voltage level and connect the first circuit slice to the second voltage level, and to disconnect at least a second circuit slice having a second time constant from the second voltage level and connect the second circuit slice to the first voltage level, such that a rising edge in an output waveform at the driver output has a peaking characteristic.

The peaking characteristic may be a peak magnitude of a voltage peak. The output signal waveform may comprise a first portion having a first time rate based on the first time constant and a second portion subsequent to the first portion having a second time rate based on the second time constant. The first portion and second portion defines the voltage peak.

The second programmable time constant may be larger than the first programmable time constant. Switches in the plurality of circuit slices may be further configured to disconnect the first circuit slice from the second voltage level and connect the first circuit slice to the first voltage level, and to disconnect the second circuit slice from the first voltage level and connect the second circuit slice to the second voltage level, such that a falling edge in the output waveform at the driver output has the programmable peaking characteristic.

The second time constant may be a programmable time constant, and the second circuit slice may comprise a resistor having a first resistor terminal and a second resistor terminal; a slice output connected to the first resistor terminal and the driver output; a capacitor having a programmable capacitance connected to the second resistor terminal. The programmable time constant may be based on the programmable capacitance of the capacitor.

The one or more switches may be configured to switchably connect the second resistor terminal of the resistor to either the first voltage level or the second voltage level, or to switchably disconnect the second resistor terminal from the first voltage level and the second voltage level, such that the voltage driver circuit has a programmable output impedance at the driver output. The one or more switches may also comprise a first switch configured to selectively connect the second resistor terminal to the first voltage level, and a second switch configured to selectively connect the second resistor terminal to the second voltage level, such that the voltage driver circuit has a programmable output voltage at the driver output.

The first and second switches may be silicon metal-oxide-semiconductor (MOS) transistors. The resistor in each circuit slice may comprise polysilicon.

The first switch may comprise a first transistor and a third transistor serially coupled between the first voltage level and the second resistor terminal, and the second switch may comprise a second transistor and a fourth transistor serially coupled between the second voltage level and the second resistor terminal. The first, second, third and fourth transistors may be silicon metal-oxide-semiconductor (MOS) transistors. The third transistor may have a higher characteristic operating voltage than the first transistor, and the fourth transistor may have a higher characteristic operating voltage than the second transistor.

The plurality of circuit slices may be a first group of circuit slices; each slice output of the first group of circuit slices may be connected to the driver output through a first circuit path having a first resistance. The voltage driver circuit may further comprise a second group of circuit slices; each slice output of the second group of circuit slices may be connected to the driver output through a second circuit path comprising one or more resistors such that the second circuit path comprises a second resistance; and the second resistance is greater than the first resistance.

According to some embodiments, a voltage driver is provided. The voltage driver comprises a driver output and a plurality of circuit slices. Each circuit slice comprises a slice output connected to a first resistor terminal of a resistor and the driver output, and one or more switches configured to switchably connect a second resistor terminal of the resistor to either a first voltage level or a second voltage level, or to switchably disconnect the second resistor terminal from both the first voltage level and the second voltage level. Each circuit slice further comprises a programmable capacitor coupled to the second resistor terminal.

The plurality of circuit slices may comprise a first circuit slice having a first programmable capacitor connected to the first voltage level, the first circuit slice has a first time constant; a second circuit slice having a second programmable capacitor connected to the second voltage level, the second circuit slice has a second time constant different from the first time constant. The voltage driver may be configured to output a signal waveform at the driver output having a programmable peaking characteristic, the signal waveform comprising a first portion having a first time rate based on the first time constant and a second portion subsequent to the first portion having a second time rate based on the second time constant, the first portion and the second portion defining a voltage peak. The peaking characteristic may be a peak magnitude of the voltage peak.

According to some embodiments, a method for operating a voltage driver is provided. The voltage driver comprises a plurality of circuit slices each having a programmable time constant. The method comprises receiving from a controller first data comprising an indication of a target time domain characteristic. In response to receiving the first data, generating at a driver output of the voltage driver a signal waveform having the target time domain characteristic. Generating the signal waveform comprises adjusting the programmable time constant of one or more circuit slices.

The generated signal waveform may comprise a first portion having a first time rate and a second portion subsequent to the first portion having a second time rate, the first portion and second portion defining a voltage peak. The target time domain characteristic may be a peak magnitude of the voltage peak. Generating the signal waveform may further comprise connecting a first voltage level to the driver output via at least a first circuit slice of the plurality of circuit slices; connecting a second voltage level to the driver output via at least a second circuit slice of the plurality of circuit slices; adjusting a first programmable time constant of the first circuit slice, such that the first time rate of the first portion of the signal waveform is based on the first programmable time constant; and adjusting a second programmable time constant of the second circuit slice, such that the second time rate of the second portion of the signal waveform is based on the second programmable time constant.

The second voltage level may be higher than the first voltage level. The first portion and the second portion of the signal waveform may define a rising edge, and wherein generating the signal waveform further comprises disconnecting the first circuit slice from the first voltage level and connecting the first circuit slice to the second voltage level; and disconnecting the second circuit slice from the second voltage level and connecting the first circuit slice to the first voltage level.

The second programmable time constant may be larger than the first programmable time constant. Each circuit slice of the plurality of circuit slices may further comprise a programmable capacitor connected to the driver output via a resistor. Adjusting the programmable time constant may comprise adjusting the programmable capacitor. Each circuit slice of the plurality of circuit slices may comprise a resistor connected to the driver output, and a plurality of switches configured to switchably connect the resistor to the first voltage level or the second voltage level. The switches may be silicon metal-oxide-semiconductor (MOS) transistors.

The method may further comprise receiving from the controller second data comprising an indication of a target voltage; adjusting an output voltage at the driver output to the target voltage by selectively connecting a first number of circuit slices to the first voltage level, and a second number of circuit slices to the second voltage level.

The method may further comprise receiving from the controller third data comprising an indication of a target output impedance; adjusting a programmable output impedance at a driver output of the voltage driver to match the target output impedance by selectively connecting the first voltage level or the second voltage level to the driver output via one or more circuit slices of the plurality of circuit slices, whereby the output impedance at the driver output has one of a plurality of programmable output impedance values.

The method may further comprise receiving the first data and second data with an encoder; generating, with the encoder, driver control signals based on the received first data and second data; providing the driver control signals to control terminals of switches within the plurality of circuit slices, such that the one or more circuit slices are connected to the first voltage level or the second voltage level.

The foregoing is a non-limiting summary of the invention, which is defined by the appended claims.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
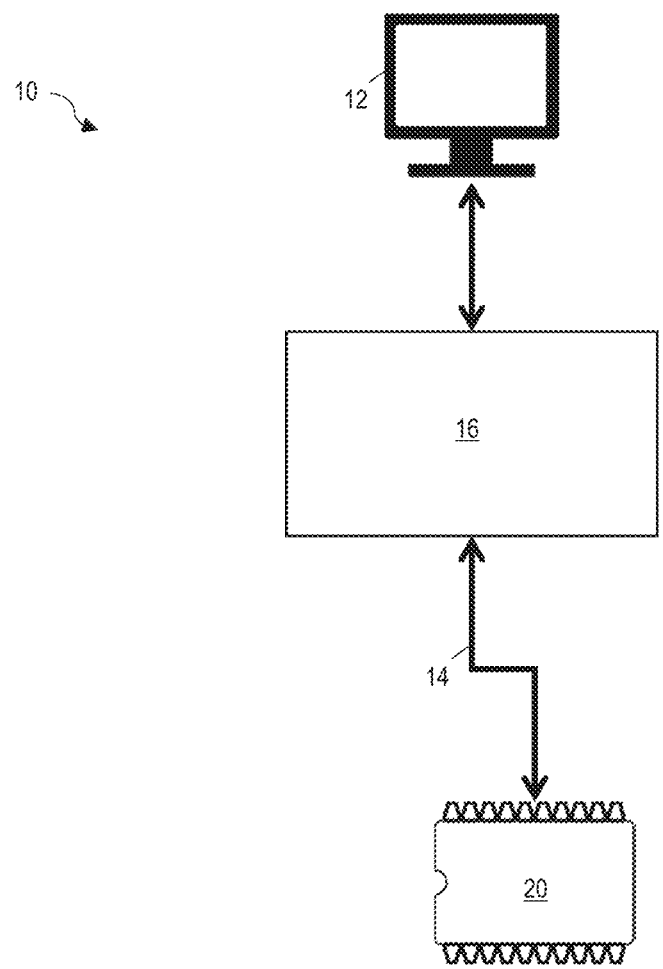
FIG. 1 is a schematic diagram of an exemplary embodiment of an automated test system in which a voltage driver circuit according to aspects of the present application may be applied.

The inventors have recognized and appreciated designs for a voltage driver circuit that enable multiple characteristics at the driver output to be programmed. These characteristics may include one or more of: voltage level, output impedance and/or time domain behavior. An adjustable output impedance, for example, may be programmed to match the impedance of different loads, providing adjustable voltages with low power consumption, particularly in high speed applications. Further, by adjusting time domain behavior of the output voltage swings, voltage peaking may be controlled. Accordingly, such a driver may enable a test system to generate waveforms that more reliably and/or more quickly and/or more accurately test a semiconductor device under test.

In accordance with some embodiments, a voltage driver may be implemented with a plurality of circuit slices. Programmable control over the voltage driver may be achieved by setting switches within each of the circuit slices that change the characteristics of the output of that circuit slide. The outputs of the slices may be connected together, so as to collectively provide an output for the voltage driver. The switches may be configured to connect components of the circuit slice to one of a plurality of voltage supplies. The number of components within each slice connected to each of the plurality of voltage supplies as well as the number of such components connected to none of the voltage supplies may impact multiple characteristics at the output of the circuit slice. The characteristics at the outputs of the circuit slices may combine to impact the characteristics, including voltage, impedance and/or time domain characteristics, at the output of the voltage driver circuit.

In some embodiments, the plurality of circuit slices may be configured in groups. The components of the circuit slices within each group may be the same, but different groups may have different components. For example, the component connected to a voltage source may be a resistor. Circuit slices within each group may have resistors of the same resistance, but slices in different groups may have resistors of different values. By controlling the ratio of slices within each of the groups in which a resistor is connected to each of multiple voltage sources, the output voltage may be set. By controlling the number of such components connected to a voltage source, other characteristics, such as impedance or time domain characteristics, may be set.

Aspects of the present application can provide a low leakage current at the output pin from the voltage driver when all driver slices are de-activated (sometimes also referred to as "tri-stated"). In some embodiments, the disclosed driver can provide at least four aspects: (1) segmentation to accurately set a plurality of programmable voltage levels, (2) segmentation to adjust output resistance or impedance (for instance to 50 ohm), (3) time domain characteristics such as inverted slice peaking (ISP), which is discussed in more detail below, and (4) a switch design that enables low output leakage current from the entire driver when all switches are tri-stated. For example, a voltage driver according to aspects of the present application may provide a few nA or less level of leakage current at the output pin across the entire output voltage range, which is desirable in an ATE.

According to some embodiments, a method for operating a voltage driver is provided. The voltage driver comprises a plurality of circuit slices. The method comprises receiving from a controller first data comprising an indication of target time domain behavior of aspects of the driver output waveform. In response to receiving the first data, adjusting programmable time constants and signal polarities for various groups of slices to obtain desired waveform shaping, including peaking behavior. The waveform behavior is one of a plurality of programmable behaviors.

FIG. 1 is a schematic diagram of an exemplary embodiment of an automated test system in which a voltage driver circuit according to aspects of the present application may be applied. FIG. 1 illustrates a test system 10 that contains a test computer 12 that controls a tester 16 to perform tests on a device under test (DUT) 20 in accordance to methods disclosed in the present application. In some scenarios, the tester 16 may be an automated test equipment (ATE), constructed using techniques that are known in the art. The DUT 20 may be any suitable device for testing. For example, DUT 20 may be a semiconductor device. ATE 16 may contain circuitry to generate and/or measure a test signal 14 for DUT 20. ATE 16 may include multiple instruments configured to generate or measure different types of analog or digital signals.

According to an aspect of the present application, some instruments within ATE 16 may be implemented in the form of pin electronics (PE) with a PE driver that generates output voltage signals of a designed magnitude and timing to provide to a device under test (DUT). For example, digital test instruments, which generate and/or measure digital signals, may be implemented with such PE circuits. Regardless of the specific type of instrument in which it is used, the PE may be implemented as integrated circuits (ICs) that comprise a large number of transistors, such as complementary metal-oxide semiconductor (CMOS) transistors.

It should be appreciated that FIG. 1 is a greatly simplified representation of an automated test system. For example, though not illustrated, test system 10 may include control circuitry that controls operation of instruments within ATE 16. Additionally, test system 10 may include processing circuitry to process measurements and determine whether a DUT 20 is operating correctly. Also, FIG. 1 illustrates a single signal path between ATE 16 and DUT 20. One of skill in the art will appreciate that testing a modern DUT may require hundreds or thousands of test signals to be generated and measured. Accordingly, circuitry as described herein may be duplicated many times within ATE 16 and controlled to provide synchronized test signals for testing DUT 20. Further, though FIG. 1 illustrates a scenario in which a single DUT 20 is being tested, test system 10 may be configured to test multiple devices.

Regardless of the number of instruments or other components generating or measuring test signals and the number of devices under test, test system 10 may include signal delivery components that route the signals between the DUT 20 and the instruments within ATE 16.

Further, it should be appreciated that other components as illustrated are exemplary rather than limiting. For example, although the test computer 12 is illustrated as a personal computer (PC) in FIG. 1, it should be appreciated that any suitable computing device may be used to implement a test computer, for example, a mobile device or a computer work station. Test computer 12 may be connected to a network and capable of accessing resources over the network and/or communicate with one or more other computers connected to the network.

Figure 2A:
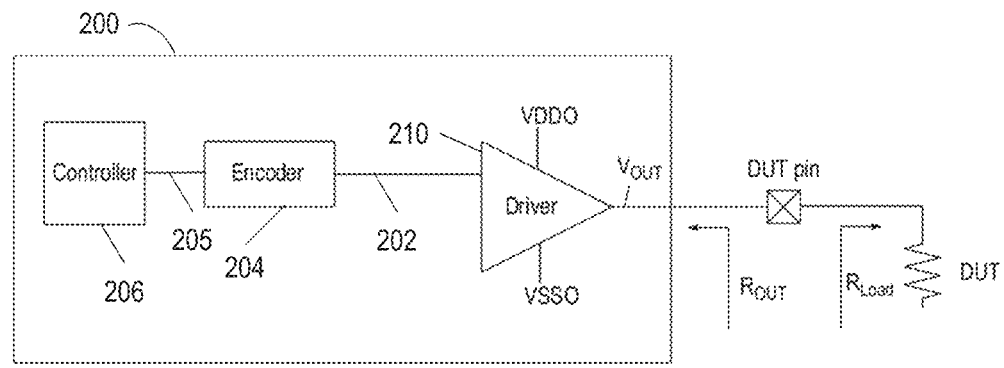
FIG. 2A is a schematic diagram showing an exemplary pin electronics (PE), according to an aspect of the present application.

FIG. 2A is a schematic diagram showing an exemplary PE 200, according to an aspect of the present application. PE 200 includes a voltage driver circuit 210 coupled to a first supply voltage VDDO and a second supply voltage VSSO, and configured to provide an output voltage at output $V_{OUT}$ in response to driver control signal 202 received from encoder 204. Encoder 204 may generate driver control signal 202 based on input data 205 received from controller 206. It should be appreciated that driver control signal 202 may be an aggregate of a plurality of control signals that set configurations of multiple components within the voltage driver circuit 210 to control the output voltage at $V_{OUT}$. While a single signal path is illustrated in FIG. 2A for driver control signal 202, it should be appreciated that embodiments of the present invention are not so limited and in some embodiments, separate control signals within driver control signal 202 may be applied to multiple control terminals of components within the voltage driver circuit 210. For example, encoder 204 may supply a control signal to each control terminals of a plurality of switches and programmable capacitors within voltage driver circuit 210. One or more of the control signals may operate at high speed, such as to enable fast switching between the two voltage levels, while the rest of the control signals may operate at low speed to configure the driver before high-speed operation commences, such as to control the voltage levels and/or other driver characteristics.

Still referring to FIG. 2A, controller 206 comprises logic, processors and/or memory elements, and may be disposed either within or external to the PE 200. Input data 205 from controller 206 may be high speed data having data rates on the order of multiple Gbps, such as up to 10 Gbps. Input signal 205 may be a high speed data stream having a data rate of 5 Gbps, 20 Gbps, between 1 and 100 Gbps, or between 5 and 50 Gbps, although it should be appreciated that various aspects of the technology disclosed herein may be used with a data stream having any bandwidth. In some embodiments, input data 205 comprises a data stream of values of desired output voltage level versus time. Input data 205 may also comprise configuration data indicative of a target output impedance and time domain peaking behavior. Encoder 204 is configured to generate driver control signal 202 based on the received input data 205 to configure the voltage driver circuit 210 to generate an output voltage at $V_{OUT}$ with a waveform that substantially corresponds to the values indicated in input data 205. In some embodiments, a DUT may be connected to $V_{OUT}$ via DUT pin on the exterior of the PE.

According to an aspect of the application, the inventors have recognized and appreciated that when a PE such as PE 200 is used to test DUT at high data rates on the order of multiple Gbps, such as up to 10 Gbps, there are challenges in providing precise control over the output voltage levels, output impedance, and time domain behaviors of the output waveform such as peaking and slew rate. A voltage driver circuit, as will be described in detail below, may be used to address some or all of these challenges.

Referring to FIG. 2A, one aspect of the present application is directed to providing an adjustable output resistance $R_{OUT}$ at the output of the voltage driver circuit 210 such that it can be set to a desired value, such as to substantially matches the load resistance $R_{Load}$ of the DUT connected to the DUT pin. Matching the load resistance in this way reduces attenuation of signals transmitted from the voltage driver circuit to the load due to impedance mismatch. Reduced attenuation may be particularly desirable at high data rates. The inventors have recognized and appreciated that the output resistance $R_{OUT}$ may be adjusted when $R_{Load}$ varies, for example when testing different types of DUT, or to account for environmental and on-die manufacturing variations on the same type of DUT. For high frequency operations, aspects of the present application may similarly apply to adjustability of the output impedance, taking into consideration reactive components in the circuit.

According to an aspect of the present application, a voltage driver circuit comprises one or more groups of circuit slices. The circuit slices within a group are connected in parallel between VSSO and VDDO. Each circuit slice also comprises a slice output, with slice outputs of circuit slices within a group coupled to a same node. Within each circuit slice, a resistor is switchably connects the slice output to one or none of supply voltages. In at least one group of circuit slices, the slice outputs are connected to a driver output of the voltage driver circuit. The inventors have recognized and appreciated that a resistor connecting the driver output to one of VSSO or VDDO contributes to $R_{OUT}$ by the resistance of the resistor, and therefore by connecting a selected number of circuit slices to the driver output, the output resistance $R_{OUT}$ may be programmable based on a parallel combination of the $R_{OUT}$ in the selected number of circuit slices.

According to some embodiments, a first resistor terminal of the resistor within each circuit slice is connected to the slice output. Each circuit slice comprises switches coupled to and controlled by control signals from an encoder to switchably connect a second resistor terminal of the resistor within the circuit slice to one of VDDO and VSSO, or disconnected from both VDDO and VSSO. When a slice output is connected the driver output, the output resistance $R_{OUT}$ is based on a parallel combination of circuit slices that have resistors connected to VDDO or VSSO. These circuit slices may also be referred to as "activated." Circuit slices with the resistor disconnected to either VDDO and VSSO may be referred to as "disconnected" or "deactivated."

According to some embodiments, the circuit slices may be implemented as circuit modules that have the same design and have the same number of circuit elements to simplify circuit design, although it is not a requirement that all circuit slices be implemented identically. In some embodiments, the switches are metal-oxide semiconductor field-effect transistors (MOSFET) such as but not limited to silicon (Si) MOSFET. In one embodiment, the circuit slices comprise Si CMOS and are fabricated using silicon semiconductor manufacturing techniques known in the art. The inventors have appreciated and recognized that implementing part or all of the voltage driver circuit with Si CMOS technology may reduce power consumption. In such an implementation, each circuit slice may be controlled to be in at least one of three states: a high state, with switches connecting the resistor to VDDO; a low state, with switches connecting the resistor to VSSO; and a tri-state, with the first resistor terminal not connected to either VDDO or VSSO, and thus in a floating state.

Aspects of the present application also provide control of output voltage at the driver output. In some embodiments, an output voltage at the slice outputs of a group of circuit slices is adjustable by selectively connecting a first number of circuit slices to VDDO, and selectively connecting a second number of circuit slices to VSSO, or connecting a first ratio of circuit slices to VDDO, and selectively connecting a second ratio of circuit slices to VSSO. In some embodiments, connecting a circuit slice to VDDO or VSSO comprises controlling switches within the circuit slice to connect the first resistor terminal of the resistor to VDDO or VSSO. It should be appreciated that when 100% of the activated circuit slices within a group are connected to VDDO, the open circuit output voltage at the slice outputs will be VDDO. Similarly, when 100% of the activated circuit slices are connected to VSSO, the open circuit output voltage at the slice outputs will be VSSO. Thus when some ratio of the activated circuit slices are connected to VDDO, and the rest of the activated circuit slices are connected to VSSO, the output voltage will be at an intermediate level between VSSO and VDDO.

Because output resistance is adjusted by the number of activated slices, and output voltage is adjusted by the ratio of slices connected to VDDO vs. VSSO within the activated slices, aspects of the present application can provide independent adjustability of output resistance and output voltage.

The number of steps, or number of different values to which the output voltage of the driver can be set, is dependent on the number of circuit slices provided in parallel between the two supply voltages. The step-size, or granularity at which the output voltage of the driver can be changed, depends on the difference between the voltage represented by the smallest step relative to the largest step, divided by the number of steps. Finer control over the output voltage over a relatively large voltage range may be provided with groups of circuit slices, with each group providing output voltages controllable with different step sizes. The output voltages of the groups may be combined to provide the output of the voltage driver.

In some embodiments, the voltage driver circuit may further comprise segmented groups of slices, functioning as a segmented voltage divider ladder. A first group of most-significant bit (MSB) slices, or "coarse slices," have slice outputs directly connected to the driver output, while a second group of less-significant bit (LSB) slices, or "fine slices," have slice outputs connected to the driver output through a string of one or more resistors. More than one LSB segments, and thus more than one groups of LSB or fine slices may be provided to provide additional fine adjustability. The coarse slices and fine slices are connected to the driver output via a network of resistor ladders, such that a change in voltage at slice outputs of the coarse slices contributes to a coarse step that is bigger than a fine step resulting from a similar level of change in voltage at slice outputs of fine slices. The segmented voltage driver circuit as described herein may use any voltage divider resistor ladder network known in the art, such as but not limited to a R-2R ladder, a R-8R ladder. In addition to providing coarse and fine levels of adjustments of output voltage at the driver output, it should be appreciated that such a segmented voltage divider ladder provides similar coarse and fine levels of output resistance adjustability, with a change in output resistance at slice outputs of the coarse slices contributing to a coarse step in $R_{OUT}$, compared to that from the same change in output resistance at slice outputs of the fine slices.

Figure 2B:
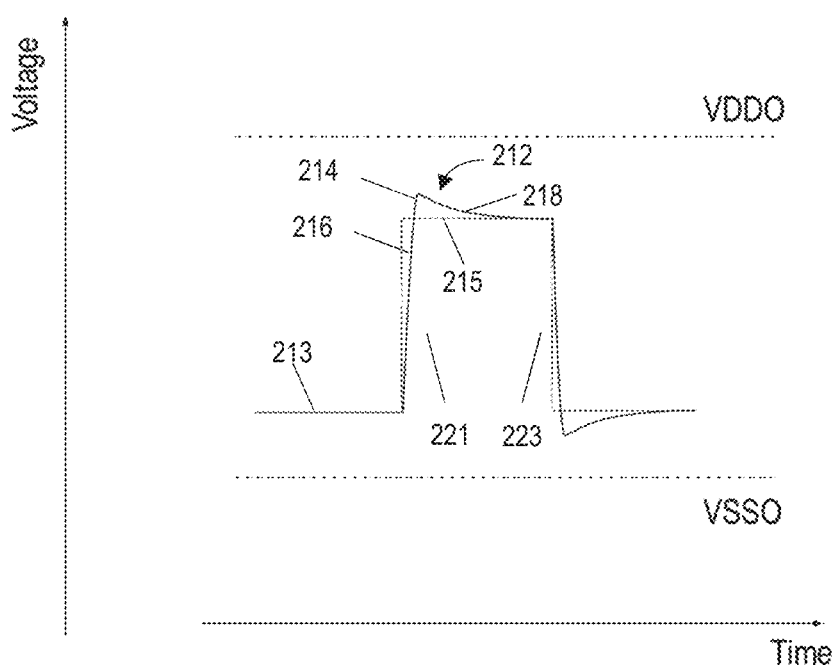
FIG. 2B is an output voltage waveform versus time at the driver output during an exemplary signal transition.

FIG. 2B is a schematic diagram of an output voltage waveform versus time at the driver output during an exemplary signal transition. FIG. 2B illustrates a portion of a digital waveform that has a low level, illustrated as level 213, and a high level, illustrated as level 215. With a driver as described herein, the voltage level corresponding to levels 213 and 215 may be set, under program control, by adjusting the ratio of the number of circuit slices in each of the groups of circuit slices connected to VDDO or VSSO. The output resistance may be set, under program control, by adjusting the number of circuit slices within each group connected to one of VDDO or VSSO, versus disconnected from both.

In addition to control of output resistance and output voltage, aspects of the present application also provide control of time domain behavior such as a programmable peaking characteristic of the output waveform of the voltage driver circuit. FIG. 2B illustrates an exemplary peaking behavior in waveform 212, when the voltage driver receives a data signal 205 indicating an increase of output voltage from a level 213 to a higher level 215. Rather than transitioning instantaneously, delays in various circuit components cause waveform 212 to have a rising portion 216, and typically overshoots the target level 215 until a peak 214, and then have a falling portion 218. The rising portion 216 and falling portion 218 may define a rising edge 221. Similarly, waveform 212 may also have a falling edge 223 as shown in FIG. 2B. Peaking refers to the waveform shape of the rise, fall and peak portions 216, 218 and 214, including the peak magnitude of peak 214 relative to the stabilized output voltage level 215. The inventors have appreciated and recognized that during peaking, instantaneous voltage at the peak 214 may overshoot and thus be beyond the desired voltage level 215, and if uncontrolled, may undesirably exceed a compliance voltage level of the PE or the DUT. According to an aspect of the present application, configuration of the time constants of activated circuit slices impacts time domain characteristics at the output of the voltage driver circuit, such as the time rate, or a rate of change in voltage versus time of the rise and fall portions 216, 218. By selecting an appropriate time constant of the slices, peaking behavior can be controlled.

The inventors have recognized and appreciated that each circuit slice in the voltage driver circuit as described in the sections above may have a programmable time constant T for voltage transition based on a product of the resistance and capacitance within the circuit slice.

According to some embodiments, a programmable capacitor may be provided and connected to the resistor in each circuit slice. According to an aspect of the present application, when voltage indicated in a data signal 205 increases from level 213 to level 215 is applied to the voltage driver, activated circuit slices that connect to VDDO tend to cause the output voltage to move in the same direction as what is indicated by the data signal 205, as VDDO is higher than voltage level 213. These activated slices that tend to cause the output voltage to move in the same direction as what is indicated by the data signal 205 may be referred to as "non-inverted slices." Similarly, activated slices that tend to cause the output voltage to move in the opposite direction as what is indicated by the data signal 205 may be referred to as "inverted slices."

In the example illustrated in FIG. 2B, during the rising edge 221, slices that connect to VDDO may be referred to as "non-inverted slices." Such non-inverted slices may be previously connected to VSSO, and are controlled to be disconnected from VSSO and instead connected to VDDO to drive the output signal to rise to the target voltage level to generate a rising edge. Slices that connect to VSSO may be referred to as "inverted slices," as VSSO is lower than voltage level 213 and is opposite to the call for a rise in voltage level from 213 to 215 as indicated by drive signal 205. Such inverted slices may be previously connected to VDDO, and are controlled to be disconnected from VDDO and instead connected to VSSO. It should be appreciated that in such an example, falling edge 223 may be generated by connecting non-inverted slices to VSSO, and inverting slices to VDDO.

The inventors have appreciated and recognized that time rate in rise portion 216 in waveform 212 is dominated by time constants in the non-inverted slices, while time rate in the fall portion 218 is dominated by time constants in the inverted slices. By selectively controlling the inverted slices to have a longer time constant $\tau_1$, the fall portion 218 may be adjusted to have a lower (or smaller) time rate compared to rise portion 216. Similarly, time rate of rise portion 216 may be adjusted by selectively controlling the non-inverting slices to have a particular time constant $\tau_1$. The techniques described herein may sometimes be referred to as an inverted slice peaking (ISP) technique. While both inverted and non-inverted slices may have programmable time constants, it should be appreciated that it is not a requirement that time constants for all slices be adjustable. For example, one or more of the non-inverted slices may comprise a fixed time constant, while only the inverted slices have programmable time constants, or vice versa. Time constants in both non-inverted and inverted slices may also both have fixed values that are designed to provide desired peaking characteristics.

The inventors have appreciated and recognized that a peaking characteristic such as the shape and/or magnitude of peak 214 may be controlled by adjusting the non-inverted and inverted time constants, either independently or in combination. For example, when the rise portion 216 is controlled to have a higher (or larger) time rate, waveform 212 may have a more significant overshoot resulting in a higher peak voltage in 214 relative to the voltage level 215. In some embodiments, $\tau_1$ and $\tau_2$ may be adjusted by selectively setting the programmable capacitance within the non-inverting circuit slices and inverting circuit slices, respectively.

Although operation of inverted slices with longer time constants leads to described peaking behavior, it should be appreciated that by operating non-inverted slices with longer time constants, a slower overall signal slew rates may be obtained, which provides a form of slew rate control. It is sometimes useful to reduce a waveform slew rate, for example to minimize interference with other signals, and embodiments as disclosed herein may also be used for such a purpose.

Some aspects of the present application are directed to a method for operating a voltage driver circuit of the type as described herein. In one embodiment, the method comprises adjusting a programmable output impedance, an output voltage, and a programmable time domain characteristic such as a voltage peaking characteristic in the output waveform. The adjustment may be performed prior to and during operation of the PE for testing the DUT, by for example providing one or more control parameters to the encoder that specifies the number of circuit slices to be activated, and if so to be connected to which supply voltage, as well as the programmable capacitance for activated slices. Such adjustments may be made in response to a user or programmed input that indicates a change in voltage output is needed. In some embodiments, control parameters may be stored in memories on the PE, such as memories within controller 206 as shown in FIG. 2A.

Figure 2C:
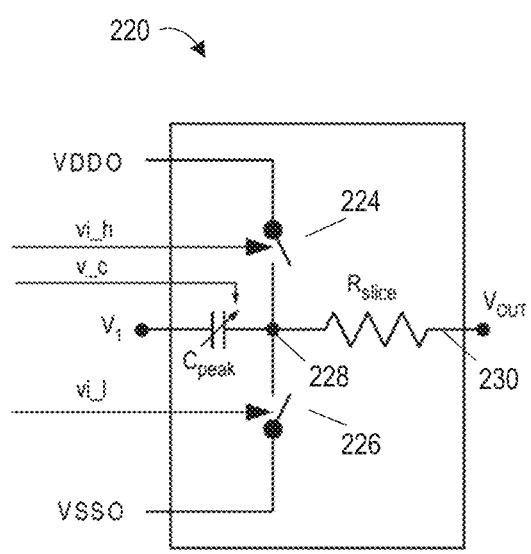
FIG. 2C is a schematic diagram of a circuit slice in an exemplary voltage driver circuit, according to some embodiments.

FIG. 2C is a schematic diagram of a circuit slice 220 in an exemplary voltage driver circuit, according to some embodiments. Circuit slice 220 comprises a resistor $R_{slice}$ having a first resistor terminal 230 connected to a slice output $V_{OUT}$, a first switch 224 connected between VDDO and a second resister terminal 228 of $R_{slice}$, and a second switch 226 connected between VSSO and the second resister terminal 308. Therefore slice output $V_{OUT}$ is connected to one of the supply voltages VDDO/VSSO through one of switches 224, 226 in series with resistor $R_{slice}$. The inventor has appreciated and recognized that the switch and series $R_{slice}$ arrangement between a supply voltage and the slice output is a low power consumption configuration that provides a large output voltage range at the slice output, at nearly the full rail-to-rail voltage range between VSSO and VDDO when the slice output is connected to an open load. Switches 224 and 226 are controlled to open/close in response to control signals vi_h and vi_l, respectively, that are received at control terminals of switches 224 and 226.

Still referring to FIG. 2B, circuit slice 220 comprises a capacitor $C_{peak}$ having a first capacitor terminal that connects to the second resistor terminal 228, and a second capacitor terminal that connects to a voltage $V_1$. Voltage V1 may be a supply voltage or a reference voltage such as ground within the PE, according to some embodiments. Capacitor $C_{peak}$ may have an adjustable capacitance, and is used to adjust a time constant of circuit slice 220 around a signal transition, such that the time domain behavior such as peaking of a voltage at the slice output $V_{OUT}$ can be adjusted. Capacitor $C_{peak}$ may include a control terminal such that the capacitance value of capacitor $C_{peak}$ is adjusted based on a control signal v_c received at the control terminal of $C_{peak}$. Control signal v_c along with control signals vi_h and vi_l may be received as part of driver control signal 202 from encoder 204 as shown in FIG. 2A.

Details of several embodiments of the present application will be described below with reference to FIGS. 3-7.

Figure 3:
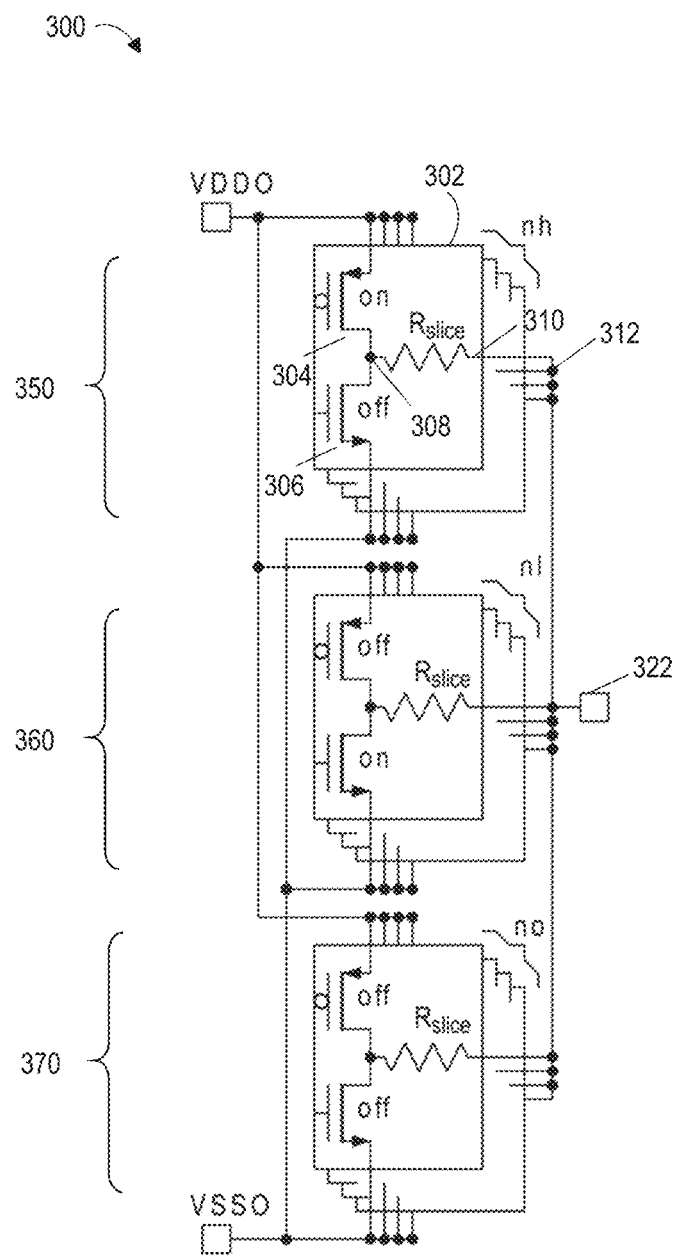
FIG. 3 is a schematic diagram of a group of circuit slices in an exemplary voltage driver circuit, according to some embodiments.

FIG. 3 is a schematic diagram of a group of circuit slices 300 in an exemplary voltage driver circuit, according to some embodiments. The group of circuit slices 300 comprises a plurality of N circuit slices 302 that are each connected in parallel between supply voltages VDDO and VSSO. While FIG. 3 shows that each circuit slice 302 is substantially identical to each other, it should be appreciated that aspects of the present application are not so limited and that it is not a requirement that circuit slices within one group be identical.

In the embodiment shown in FIG. 3, circuit slice 302 comprises a resistor $R_{slice}$ having a first resistor terminal 310 connected to a slice output 312, a first switch 304 connected between VDDO and a second resister terminal 308 of $R_{slice}$, and a second switch 306 connected between VSSO and the second resister terminal 308. Slice outputs 312 are connected together to a voltage output 322 of the group of slices. Within each circuit slice 302, the slice output 312 is connected to one of the supply voltages through one of switches 304, 306 in series with resistor $R_{slice}$. The inventor has appreciated and recognized that the switch and series $R_{slice}$ arrangement between a supply voltage and the slice output is a low power consumption configuration that provides a large output voltage range at the slice output, at nearly the full rail-to-rail voltage range between VSSO and VDDO when the slice output is connected to an open load. In some embodiments, switches 304 and 306 are implemented with Si CMOS to reduce manufacturing cost and reduce power consumption. It should be appreciated that while $R_{slice}$ is represented by a single resistor symbol in FIG. 3, implementation of $R_{slice}$ is not limited to a single resistor and may comprise, for example, one or more resistors as well as incorporation of static and dynamic resistances in other components on the circuit.

Still referring to FIG. 3, switches 304 and 306 within each circuit slice 302 may be controlled, for example by driver control signal 202 as shown in FIG. 2A, to selectively connect $R_{slice}$ to one of the supply voltages VDDO, VSSO, or neither supply voltage. A controller such as controller 206 as shown in FIG. 2A may configure the group 300 to deactivate no number of circuit slices 370, where both switches 304 and 306 are turned off. Circuit slices 350 and 360 are activated slices, having nh number of "high" slices connected to VDDO by turning on switches 304 while switches 306 are off, and nl number of "low" slices connected to VSSO by turning on switches 306 while switches 304 are off. The number of activated slices nh+nl may be selected to adjust the output impedance of the group of circuit slices 300 at output IO_DUT, while an output voltage level at voltage output 322 may be adjusted by programming the number nh and nl within activated slices.

FIG. 3 illustrates that switches 304 and 306 are each implemented by single transistors. It should be appreciated that switches may be implemented in other ways, and is not so limited.

Figure 4:
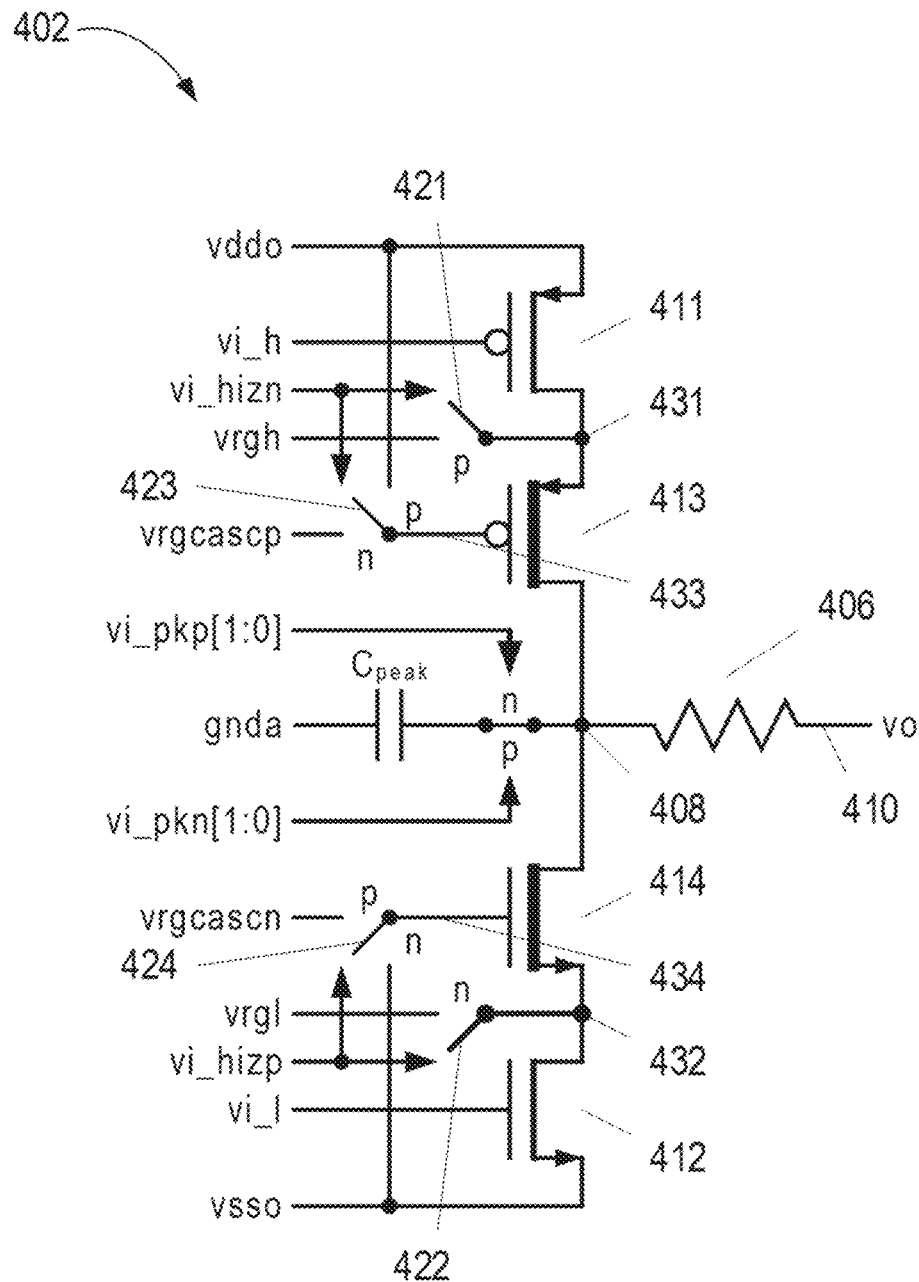
FIG. 4 is a schematic diagram of an exemplary circuit slice with a stacked transistor configuration, according to some embodiments.

FIG. 4 is a schematic diagram of an exemplary implementation of a circuit slice with a stacked MOSFET configuration, according to some embodiments. In the circuit slice 402 as shown in FIG. 4, slice output vo is coupled to first resistor terminal 410 of resistor 406. First transistor 411 and third transistor 413 are coupled serially between second resistor terminal 408 and supply voltage vddo. Second transistor 412 and fourth transistor 414 are coupled serially between second resistor terminal 408 and supply voltage vsso.

One aspect that circuit slice 402 in FIG. 4 differs from circuit slice 302 in FIG. 3 is that two serially stacked transistors 411, 413 (412, 414) are used to form a first switch (second switch) to connect a resistor 406 to supply voltage vddo (vsso) in FIG. 4, instead of the one switch 304 (306) that connects $R_{slice}$ to VDDO (VSSO) in FIG. 3. According to an aspect of the present application, the stacked transistor configuration in FIG. 4 may provide reduced leakage current from/to the switches to/from the output pin 410. In some embodiments, switches 411, 412, 413, 414 are Si MOSFETs, with switches 411 and 412 having a lower characteristic operating voltage, faster intrinsic switching capability, and larger leakage current compared to switches 413 and 414. In some embodiments, within the stacked switches 411 and 413, switch 411 is controlled by a high data rate input data signal vi_h to selectively turn on and off at a speed in the order of multiple Gbps, such as up to 10 Gbps. According to an aspect, the stacked switch 413 may reduce leakage current in a current path between vddo and resistor 406 when switch 411 is turned off. In the example shown in FIG. 4, leakage current when switch 411 is turned off may be reduced by closing switch 421 between node 431 and vrgh via control signal vi_hizn and throwing switch 423 at the gate of transistor 413 from vrgcascp to vddo via the same control signal vi_hizn. Depending on the voltage of vrgh this may achieve voltages at the gate and source terminals of transistor 413 that strongly turn off said switch which reduces undesired leakage current from vddo to vo through stacked switches 411 and 413. In some embodiments, stacked switches 411 and 413 are implemented as stacked transistors. Similarly, the stacked switch 414 may reduce leakage current in a current path between vsso and resistor 406 when switch 412 is turned off by closing switch 422 between node 432 and vrgl via control signal vi_hizp and throwing switch 424 at the gate of transistor 414 from vrgcascn to vsso via same control signal vi_hizp. Depending on the voltage of vrgl this may achieve voltages at the gate and source terminals of transistor 414 that strongly turn off said transistor which reduces undesired leakage current from vo to vsso through stacked transistors 414 and 412. In some embodiments, switches 413 and 414 are controlled by fixed voltages vrgcascp, vrgcascn at their gate terminals. In one embodiment, switches 411, 412 are Si MOSFETs with a characteristic operating voltage that is about half of that of switches 413, 414.

Still referring to FIG. 4, when switches within circuit slice 402 are operated to connect slice output 410 to one of the supply voltages, the resistance between slice output vo and the connected supply voltage depends on several factors, including the resistance of resistor 406, and on-resistance of the switches in the current path from the slice output to the connected supply voltage. In the example illustrated in FIG. 4, resistor 406 has a resistance of about 80% to 100% of the total output resistance at the slice output, and the total on-state resistance of the two stacked switches 411, 413 or 412, 414 is about 20% to 10% of the total output resistance at the slice output. The total output resistance at the slice output vo is targeted to be N*50 ohm, where N is the number of driver slices intended to be used to synthesize a 50 ohm overall output impedance. In some embodiments, resistor 406 is a single discrete resistor. In one non-limiting example, resistor 406 comprises a poly-silicon resistor.

Further in relation to FIG. 4, circuit slice 402 comprises a capacitor $C_{peak}$ connected to the second resistor terminal 408. Capacitor $C_{peak}$ may be used to adjust a time constant of circuit slice 402 around a signal transition, such that the time domain behavior such as peaking of a voltage at the slice output vo can be adjusted. Capacitor $C_{peak}$ may be implemented in any suitable method, and may include a control terminal such that the capacitance value of Capacitor $C_{peak}$ is adjusted based on a control signal received at the control terminal.

Figure 5:
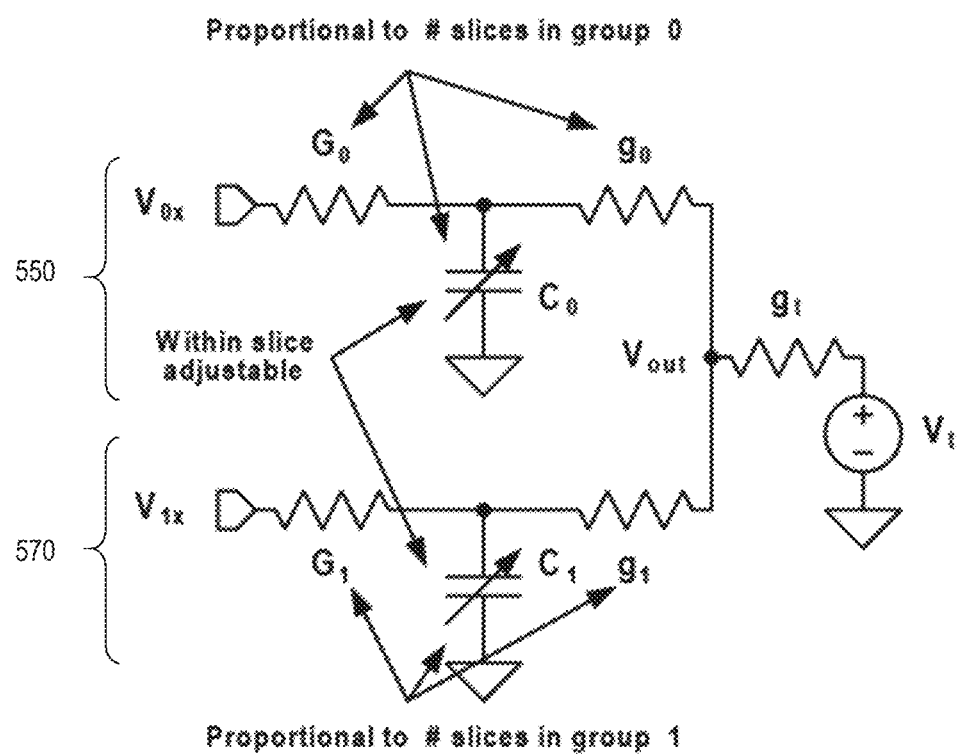
FIG. 5 is a schematic circuit diagram of groups of circuit slices with adjustable time constants, according to some embodiments.

FIG. 5 is a schematic circuit diagram of groups of circuit slices with adjustable time constants, such as the circuit slice as shown in FIG. 2C. In FIG. 5, circuit 550 is a Thevenin equivalent circuit representative of a first group (group 0) of non-inverting circuit slices, while circuit 570 is a Thevenin equivalent circuit representative of a second group (group 1) of inverting circuit slices. The non-inverting circuit slices in circuit 550 are connected to a voltage $V_{ox}$, while the inverting circuit slices in circuit 570 are connected to a voltage $V_{lx}$. $V_{ox}$ and $V_{lx}$ are Thevenin equivalent voltages that instantly follow a drive data signal and its inverse, respectively. When the drive data signal indicates an increase in output voltage, $V_{ox}$ increases while $V_{lx}$ decreases, and vice versa.

Still referring to FIG. 5, the conductances in group 0 and group 1 relate to how many active slices are in their respective groups. $G_{0/1}$ represent the FET switch conductances within the slices, while $g_{0/1}$ represent the slice resistors that are commonly connected at output $V_{out}$. In some embodiments, $G_x$ tends to be larger than $g_x$ (x={0,1}) for example almost 10 times bigger. For simplicity, assuming that $G_x$ is so much larger than $g_x$ that the V, G, C combination may be approximately viewed as a new voltage source with time constant $\tau_x = C_x / G_x$. Then the effective circuits 550 and 570 degenerate into two voltage sources, moving in opposite directions and resistively coupled at $V_{out}$ with different time constants $\tau_0$ and $\tau_1$. The output voltage $V_{out}$ then is the weighted sum of these two voltage sources, with weights proportional to the $g_x$, with contributions from each voltage source referred to as "voltage contributed to $V_{out}$" within the context of the simplified circuit model in FIG. 5. In some embodiments, $C_x$ may represent a programmable capacitor, such as $C_{peak}$ as shown in FIG. 4 alone or in combination with other sources of capacitance in the circuit slice.

Figure 6:
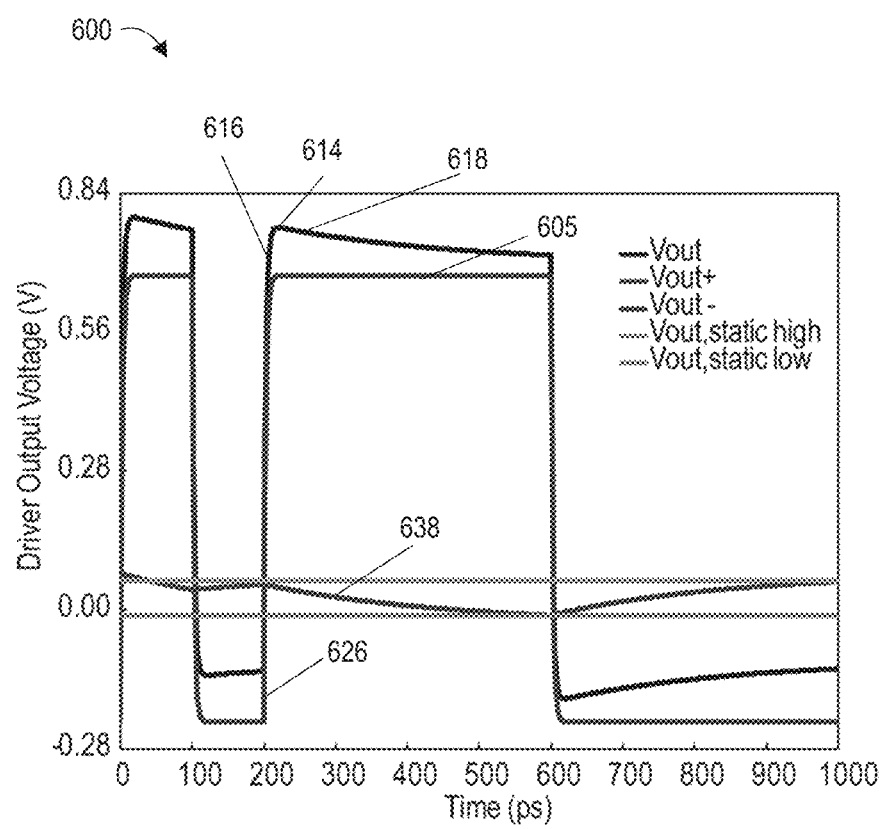
FIG. 6 is a plot of several exemplary waveforms, according to some aspects.

FIG. 6 is a plot of several exemplary waveforms that may be generated with a driver circuit as described herein. Data plot 600 shows a simulated waveform $V_{out}$ at the corresponding node as shown in the circuit diagram in FIG. 5. Waveform $V_{out}$ is simulated with an external load resistance of 50Ω is applied to terminate $V_{out}$ to ground. Group 1, which are the inverted slices in this example, are configured to have about 200 ps slower time constant than group 0, which are the non-inverted slices in this example. The voltages contributed to $V_{out}$ by group 0 and 1 are shown as $V_{out+}$ and $V_{out-}$. As data plot 600 shows, $V_{out}$ is the sum of all the slice group voltages $V_{out+}$ and $V_{out-}$, and exhibits a peaking behavior with rise portion 616 dominated by the time constant of rise portion 626 within $V_{out+}$, and fall portion 618 dominated by the time constant of fall portion 638 within $V_{out-}$. As a result, peaking behavior such as magnitude of peak 614 in may be adjusted by adjusting the time constants of slices within group 0 and group 1, separately or in combination.

Aspects of the present application therefore provide adjustability of peaking behavior by adjusting time constants of one or more circuit slices, while maintaining independent adjustability of output impedance and output voltage level as discussed above. Controlling peaking behavior has the advantage of ensuring instantaneous voltage output form the voltage driver circuit stays within a range of voltage constraints typically defined to compensate for signal losses in the path 14 from tester 16 to DUT 20. For example, and with reference to FIG. 6, a peaking voltage may be defined as the difference between peak 614 and a steady state voltage level 605. In some embodiments, output voltage peak-to-peak swing may be approximately increased by twice the peaking voltage beyond the target settled voltage range, to account for overshoots during peaking behavior. In some embodiments, time constants for the non-inverting and inverting slices are configured such that the peaking voltage is between 1% and 30% of the stabilized output voltage level, between 2% and 20%, or between 5% and 15%. The inverted slice peaking method results in peaking voltages that may be absolutely programmable. For small settled voltage range this allows very large peaking percentages to be employed, that may for example go over 100% if settled voltage swing is small, for example a few 100 mV.

In some embodiments, encoder 204 may be programmed to map programmable driver input signals, to the appropriate driver characteristics. In some embodiments, a calibration or computation may be performed for the driver so that it is possible to determine output voltage, impedance and time constant given for a sufficient number of representative combinations of driver control input signals. A calibration may be repeated under varying load conditions such as load resistance and desired output voltage level. As a result of the calibration, for a desired set of driver characteristics, a set of driver control input signals may be selected that delivers those characteristics as closely as possible.

Figure 7:
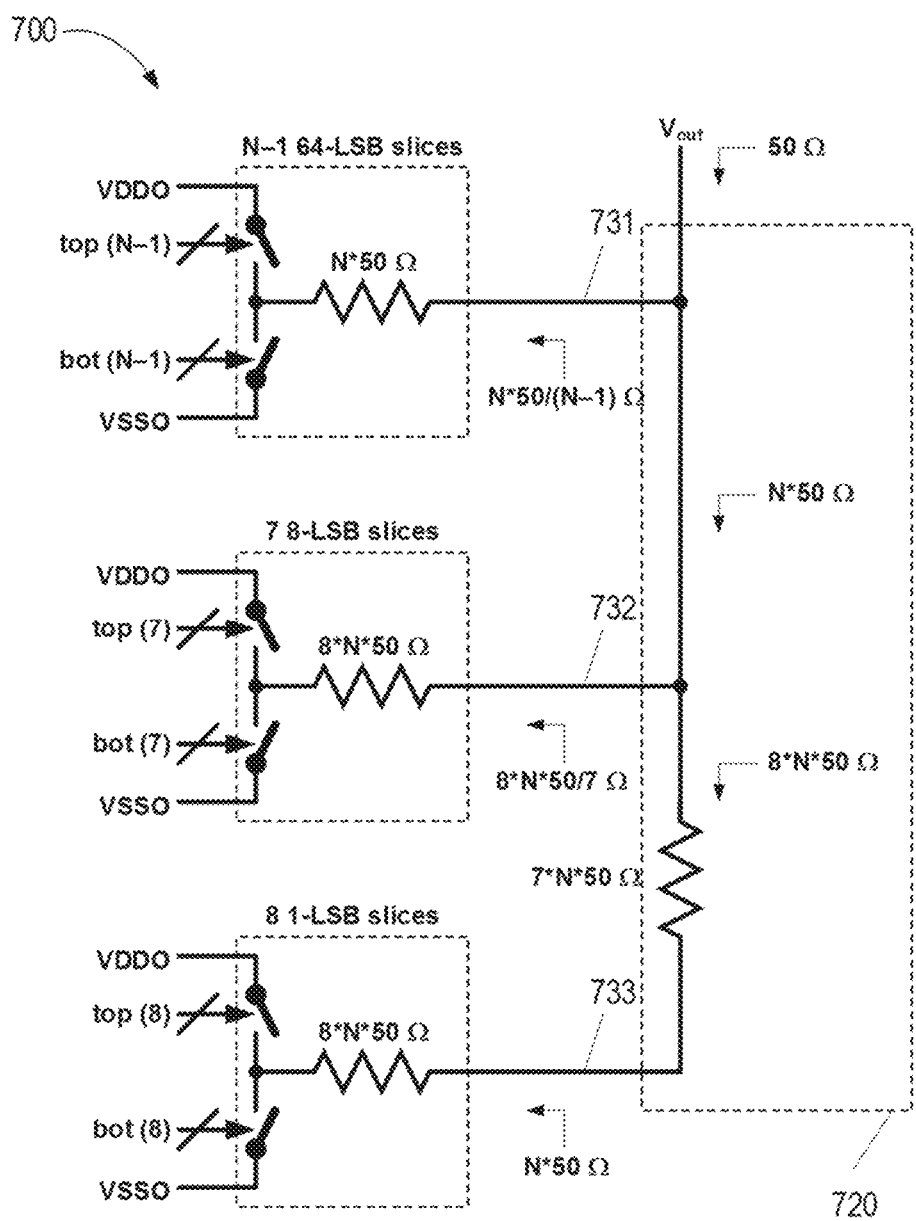
FIG. 7 is a schematic diagram of a segmented voltage driver circuit, according to some embodiments.

FIG. 7 is a schematic diagram of a segmented voltage driver circuit in which multiple groups of circuit slices may be used to expand the range of voltages that may be generated by a driver circuit, according to some embodiments. FIG. 7 shows a voltage driver circuit 700 that comprises a first segment of N−1 64-LSB slices, or coarse slices connected in parallel, a second segment of 7 8-LSB slices connected in parallel, as well as a third segment of 8 1-LSB slices connected in parallel. Here N is the number of 64-LSB slices that would result in a parallel output resistance of 50Ω.

In FIG. 7, the slice outputs of each circuit slices within the first segment of 64-LSB slices are directly coupled to a voltage output $V_{out}$, and each circuit slice within the first segment has a resistor of N×50Ω. The second and third segments of circuit slices are connected to $V_{out}$ through a string of resistor network 720. Each circuit slice within the second and third segment has a resistor of 8×N×50Ω. In the embodiment shown in FIG. 7, the bottom part of resistor network 720 is configured to form a R-8R divider network. The output 731 of the first segment and output 732 of the second segment of circuit slices are coupled together, while output 732 of the second segment of circuit slices and output 733 of the third segment of slices are connected via a resistor of 7×N×50Ω within resistor network 720.

In FIG. 7, output impedance at $V_{out}$ is determined by the number of slices shown. But in general, more slices of each variety are included to be able to adjust the output impedance either lower or higher than 50Ω. This is also done to be able to correct for on-die resistances and FET impedances coming out different from the ideal values, Furthermore, some of these slices may have different peaking capabilities than other slices as desired by practical considerations constraining the actual slice designs.

Having thus described several aspects of at least one embodiment of this invention, it is to be appreciated that various alterations, modifications, and improvements will readily occur to those skilled in the art.

For example, while some embodiments as described herein use two supply voltage rails, it should be appreciated that aspects of the present application is not so limited and may be implemented with more than two voltage rails, with one or more circuit slice connected between the more than two voltage rails. Alternatively or additionally, one of the supply voltage rails may be connected to ground.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

For example, an output resistance or output impedance can be said to be "match" to a load resistance or load impedance in some embodiments. It should be appreciated that these impedances or resistances need not be identical. To the contrary, impedances may be matched if, over some frequency range of interest, or at a nominal frequency of interest, the impedances or resistances differ by less than some threshold amount. The threshold may be specified as a relative value, such as a percentage difference. As an example, impedances in some embodiments may be considered matched if they differ by less than 5%. Though, in other embodiments, differences of up to 10%, 15% or 20% may be regarded as matched. The differences regarded as acceptable in any specific embodiment may depend on whether such a change in impedance creates a reflection large enough to be significant in impacting performance of an electronic device. Accordingly, it shall be appreciated that the specific threshold used in regarding impedances as "matched" or "consistent" is not critical to the invention. In other embodiments, the threshold may be specified in terms of Ohms. For example, a difference of 20Ω or less may be regarded as matched. In other embodiments, differences of 1 Ω, 5 Ω or 10 Ω may be regarded as "matched" or "consistent."

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A voltage driver, comprising:
   a driver output;
   a plurality of circuit slices, each circuit slice comprising:
      a programmable time constant;
      one or more switches configured to switchably connect the driver output to a first voltage level or a second voltage level higher than the first voltage level;
   wherein:
   switches in the plurality of circuit slices are configured to disconnect at least a first circuit slice having a first programmable time constant from the first voltage level and connect the first circuit slice to the second voltage level, and to disconnect at least a second circuit slice having a second programmable time constant from the second voltage level and connect the second circuit slice to the first voltage level, such that a rising edge in an output waveform at the driver output has a programmable peaking characteristic, and
   switches in the plurality of circuit slices are further configured to disconnect the first circuit slice from the second voltage level and connect the first circuit slice to the first voltage level, and to disconnect the second circuit slice from the first voltage level and connect the second circuit slice to the second voltage level, such that a falling edge in the output waveform at the driver output has the programmable peaking characteristic, and wherein
   the output waveform comprises a first portion having a first time rate based on the first programmable time constant and a second portion subsequent to the first portion having a second time rate based on the second programmable time constant.

2. The voltage driver of claim 1, wherein the programmable peaking characteristic is a peak magnitude of a voltage peak.

3. The voltage driver of claim 2, wherein:
   the first portion and second portion define the voltage peak.

4. The voltage driver of claim 1, wherein the second programmable time constant is larger than the first programmable time constant.

5. The voltage driver of claim 1, wherein the second circuit slice further comprises:
   a resistor having a first resistor terminal and a second resistor terminal;
   a slice output connected to the first resistor terminal and the driver output;
   a capacitor having a programmable capacitance connected to the second resistor terminal;
   wherein the programmable time constant is based on the programmable capacitance of the capacitor.

6. The voltage driver of claim 5, wherein for the second circuit slice:
   the one or more switches are configured to switchably connect the second resistor terminal of the resistor to either the first voltage level or the second voltage level, or to switchably disconnect the second resistor terminal from the first voltage level and the second voltage level, such that the voltage driver has a programmable output impedance at the driver output.

7. The voltage driver of claim 6, wherein for the second circuit slice:
   the one or more switches comprises a first switch configured to selectively connect the second resistor terminal to the first voltage level, and a second switch configured to selectively connect the second resistor terminal to the second voltage level, such that the voltage driver has a programmable output voltage at the driver output.

8. The voltage driver of claim 7, wherein the first and second switches are silicon metal-oxide-semiconductor (MOS) transistors.

9. The voltage driver of claim 8, wherein the resistor in each circuit slice comprises polysilicon.

10. The voltage driver of claim 7, wherein
    the first switch comprises a first transistor and a third transistor serially coupled between the first voltage level and the second resistor terminal, and
    the second switch comprises a second transistor and a fourth transistor serially coupled between the second voltage level and the second resistor terminal.

11. The voltage driver of claim 10, wherein the first, second, third and fourth transistors are silicon metal-oxide-semiconductor (MOS) transistors, wherein:
    the third transistor has a higher characteristic operating voltage than the first transistor, and the fourth transistor has a higher characteristic operating voltage than the second transistor.

12. The voltage driver of claim 1, wherein:
    the plurality of circuit slices are a first group of circuit slices;
    each slice output of the first group of circuit slices is connected to the driver output through a first circuit path having a first resistance;
    the voltage driver further comprises a second group of circuit slices;
    each slice output of the second group of circuit slices is connected to the driver output through a second circuit path comprising one or more resistors such that the second circuit path comprises a second resistance; and
    the second resistance is greater than the first resistance.

13. A voltage driver, comprising:
    a driver output;
    a plurality of circuit slices, each circuit slice comprising:
       a slice output connected to a first resistor terminal of a resistor and the driver output;

one or more switches configured to switchably place a second resistor terminal of the resistor in one of at least three states comprising:
   connected to a first voltage level,
   connected to a second voltage level, and
   disconnected from both the first voltage level and the second voltage level;
a programmable capacitor coupled to the resistor, wherein
the plurality of circuit slices comprises:
   a first circuit slice having a first programmable capacitor connected to the first voltage level, the first circuit slice has a first time constant; and
   a second circuit slice having a second programmable capacitor connected to the second voltage level, the second circuit slice has a second time constant different from the first time constant;
wherein the voltage driver is configured to output a signal waveform at the driver output having a programmable peaking characteristic, the signal waveform comprising a first portion having a first time rate based on the first time constant and a second portion subsequent to the first portion having a second time rate based on the second time constant, the first portion and the second portion defining a voltage peak, and
wherein the peaking characteristic is a peak magnitude of the voltage peak.

14. A method for operating a voltage driver comprising a plurality of circuit slices each having a programmable time constant, the method comprising:
   receiving from a controller first data comprising an indication of a target time domain characteristic and second data comprising an indication of a target voltage;
   in response to receiving the first data, generating at a driver output of the voltage driver a signal waveform having the target time domain characteristic, wherein generating the signal waveform comprises:
      adjusting the programmable time constant of one or more circuit slices; and
      selectively deactivating a subset of the plurality of circuit slices, such that a programmable output impedance at the driver output has one of a plurality of programmable output impedance values;
   adjusting an output voltage at the driver output to the target voltage by selectively connecting a first number of circuit slices to a first voltage level, and a second number of circuit slices to a second voltage level;
   receiving the first data and second data with an encoder;
   generating, with the encoder, driver control signals based on the received first data and second data; and
   providing the driver control signals to control terminals of switches within the plurality of circuit slices, such that the one or more circuit slices are connected to the first voltage level or the second voltage level.

15. The method of claim 14, wherein the generated signal waveform comprises a first portion having a first time rate and a second portion subsequent to the first portion having a second time rate, the first portion and second portion defining a voltage peak, wherein the target time domain characteristic is a peak magnitude of the voltage peak, and wherein
   generating the signal waveform further comprises:
      connecting a first voltage level to the driver output via at least a first circuit slice of the plurality of circuit slices;
      connecting a second voltage level to the driver output via at least a second circuit slice of the plurality of circuit slices;
      adjusting a first programmable time constant of the first circuit slice, such that the first time rate of the first portion of the signal waveform is based on the first programmable time constant; and
      adjusting a second programmable time constant of the second circuit slice, such that the second time rate of the second portion of the signal waveform is based on the second programmable time constant.

16. The method of claim 15, wherein the second voltage level is higher than the first voltage level, wherein the first portion and the second portion of the signal waveform define a rising edge, and wherein generating the signal waveform further comprises:
   disconnecting the first circuit slice from the first voltage level and connecting the first circuit slice to the second voltage level;
   disconnecting the second circuit slice from the second voltage level and connecting the first circuit slice to the first voltage level.

17. The method of claim 16, wherein the second programmable time constant is larger than the first programmable time constant.

18. The method of claim 15, wherein:
   each circuit slice of the plurality of circuit slices further comprises a programmable capacitor connected to the driver output via a resistor, wherein adjusting the programmable time constant comprises adjusting the programmable capacitor.

19. The method of claim 15, wherein each circuit slice of the plurality of circuit slices comprises a resistor connected to the driver output, and a plurality of switches configured to switchably connect the resistor to the first voltage level or the second voltage level, wherein the switches are silicon metal-oxide-semiconductor (MOS) transistors.

20. The method of claim 14, wherein selectively deactivating a subset of the plurality of circuit slices comprises:
   receiving from the controller third data comprising an indication of a target output impedance;
   adjusting the programmable output impedance at the driver output of the voltage driver to match the target output impedance by selectively connecting the first voltage level or the second voltage level to the driver output via one or more circuit slices of the plurality of circuit slices.

* * * * *